(12) United States Patent
Jang et al.

(10) Patent No.: US 9,057,125 B2
(45) Date of Patent: Jun. 16, 2015

(54) CANISTER

(71) Applicant: SAMSUNG DISPLAY CO., LTD., Yongin, Gyeonggi-Do (KR)

(72) Inventors: Choel-Min Jang, Yongin (KR); Myung-Soo Huh, Yongin (KR); Suk-Won Jung, Yongin (KR); Sung-Yong Lee, Yongin (KR); Cheol-Rae Jo, Yongin (KR); In-Kyo Kim, Yongin (KR); Sung-Hun Key, Yongin (KR)

(73) Assignee: Samsung Display Co., Ltd., Yongin (KR)

( * ) Notice: Subject to any disclaimer, the term of this patent is extended or adjusted under 35 U.S.C. 154(b) by 267 days.

(21) Appl. No.: 13/710,310

(22) Filed: Dec. 10, 2012

(65) Prior Publication Data
US 2014/0041590 A1    Feb. 13, 2014

(30) Foreign Application Priority Data
Aug. 10, 2012 (KR) .................. 10-2012-0087994

(51) Int. Cl.
*B01F 3/04* (2006.01)
*C23C 16/00* (2006.01)
*C23C 16/448* (2006.01)

(52) U.S. Cl.
CPC . *C23C 16/00* (2013.01); *B01F 3/04* (2013.01); *C23C 16/4481* (2013.01); *C23C 16/4482* (2013.01)

(58) Field of Classification Search
CPC .......................................................... B01F 3/04
USPC ............ 261/119.1, 121.1, 141, 142; 438/758; 422/129, 305
See application file for complete search history.

(56) References Cited

U.S. PATENT DOCUMENTS

| 8,137,468 | B2 | 3/2012 | Choi et al. |
| 8,146,896 | B2 | 4/2012 | Cuvalci et al. |
| 8,162,296 | B2 * | 4/2012 | Birtcher et al. ............ 261/121.1 |
| 2005/0000427 | A1 | 1/2005 | Lee et al. |
| 2008/0241805 | A1 | 10/2008 | Schantz |
| 2009/0291211 | A1 | 11/2009 | Ryu et al. |

FOREIGN PATENT DOCUMENTS

JP     63007620 A * 1/1988
KR  10-2005-0004379 A  1/2005

(Continued)

*Primary Examiner* — Robert A Hopkins
(74) *Attorney, Agent, or Firm* — Knobbe Martens Olson & Bear, LLP

(57) ABSTRACT

A canister includes an accommodation portion for accommodating a liquid material; an outlet pipe that is connected to the accommodation portion so as to discharge a gas material obtained by vaporizing the liquid material; a blocking cover that is connected to an upper surface of the accommodation portion; and a plurality of baffle plates that are disposed in the accommodation portion and are spaced apart from each other. The canister further includes a restrictor including a main body member that is disposed between the plurality of baffle plates and the blocking cover and is connected to an internal surface of the accommodation portion, an extension member extending from the main body member, and a through portion that is formed through the main body member and the extension member. A deposition procedure using the canister is efficiently performed and characteristics of a deposition layer are easily improved.

20 Claims, 7 Drawing Sheets

(56) References Cited

FOREIGN PATENT DOCUMENTS

| KR | 10-2009-0061646 A | 6/2009 |
| KR | 10-2009-0122727 A | 12/2009 |
| KR | 10-2010-0012387 A | 2/2010 |
| KR | 10-2010-0097823 A | 9/2010 |
| KR | 10-2010-0126507 A | 12/2010 |
| KR | 10-2011-0071385 A | 6/2011 |

* cited by examiner

CANISTER

CROSS-REFERENCE TO RELATED PATENT APPLICATION

This application claims the benefit of Korean Patent Application No. 10-2012-0087994, filed on Aug. 10, 2012, in the Korean Intellectual Property Office, the disclosure of which is incorporated herein in its entirety by reference.

BACKGROUND

1. Field

The present disclosure relates to a canister, a vapor deposition apparatus including the same, and a method of manufacturing an organic light-emitting display apparatus, and more particularly, to a canister, a vapor deposition apparatus including the same, and a method of manufacturing an organic light-emitting display apparatus.

2. Discussion of the Related Technology

Semiconductor devices, display devices, and other electronic devices include a plurality of thin films. Various methods may be used to form the plurality of thin films, one of which is a vapor deposition method.

The vapor deposition method uses one or more gases as raw materials to form a thin film. The vapor deposition method includes chemical vapor deposition (CVD), atomic layer deposition (ALD), and the like.

According to the ALD, after a raw material is injected and purged/pumped, a single layer or a composite layer is adsorbed to a substrate, and then another raw material is injected and purged/pumped, so that a desired single or composite atomic layer is formed.

During this deposition process, it is not easy to stably supply a raw material. In particular, when a raw material in a liquid state is vaporized and a raw material in a gas state is injected into a deposition space, it is not easy to stably accommodate the raw material in the liquid state, thereby deteriorating characteristic of a deposition layer and convenience of a deposition procedure.

Among display apparatuses, an organic light-emitting display apparatus is expected to become a next generation display apparatus due to its wide viewing angles, high contrast, and fast response speeds.

The organic light-emitting display apparatus includes an intermediate layer having an organic emission layer (organic EML) between a first electrode and a second electrode which face each other, and also includes one or more various thin films.

However, because the organic light-emitting display apparatus has increased in size and is expected to have high definition, it is difficult to deposit a large thin film with desired characteristics. Also, there is limitation in increasing the efficiency of a process of forming the large thin film.

SUMMARY

The present disclosure provides a canister, a vapor deposition apparatus including the same, and a method of manufacturing an organic light-emitting display apparatus, whereby a deposition procedure may be efficiently performed and characteristic of a deposition layer may be easily improved.

One aspect of the present invention provides a canister including an accommodation portion for accommodating a liquid material; an outlet conduit that is connected to the accommodation portion so as to discharge a gas material obtained by vaporizing the liquid material; a blocking cover that is connected to an upper surface of the accommodation portion; a plurality of baffle plates that are disposed in the accommodation portion and are spaced apart from each other; and a restrictor including a main body member that is disposed between the plurality of baffle plates and the blocking member and is connected to an internal side surface of the accommodation portion, an extension member extending from the main body member, and a through portion that is formed through the main body member and the extension member.

The accommodation portion may be divided into an upper space and a lower space by the restrictor, and the upper space and the lower space of the accommodation portion may be connected to an in fluid communication with each other through the through portion.

The main body member may be tightly attached to the internal side surface of the accommodation portion.

The extension member may extend from the main body member toward the plurality of baffle plates.

The blocking cover may be spaced apart from an outlet of the accommodation portion connected to the outlet conduit.

The blocking cover may extend over an outlet of the accommodation portion, which is connected to the outlet pipe.

The blocking cover may be spaced apart from the internal side surface of the accommodation portion.

The blocking cover may have a plate shape.

The canister may further include an inlet conduit that is connected to the accommodation portion in order to introduce carrier gas into the accommodation portion, wherein the blocking cover may be spaced apart from an inlet of the accommodation portion, which is connected to the inlet conduit.

The canister may further include an inlet conduit that is connected to the accommodation portion so as to introduce carrier gas into the accommodation portion, wherein the blocking cover may extend over an inlet of the accommodation portion, which is connected to the inlet conduit.

The canister may further include a supporter supporting the plurality of baffle plates, wherein the supporter may be formed through the plurality of baffle plates.

The supporter may be formed to contact a bottom surface of the accommodation portion.

The supporter may be connected to the blocking cover.

The canister may further include an inlet conduit that is connected to the accommodation portion in order to introduce carrier gas into the accommodation portion, wherein the inlet conduit may be spaced apart from the liquid material stored in the accommodation portion.

The canister may further include an inlet conduit that is connected to the accommodation portion in order to introduce carrier gas into the accommodation portion, wherein an end of the inlet conduit may be configured to be immersed in the liquid material stored in the accommodation portion.

The inlet conduit may be formed through the blocking cover, the restrictor, and the plurality of baffle plates.

The canister may further include one or more level sensors for measuring an amount of remaining liquid material accommodated in the accommodating portion.

Each of one or more level sensors may be disposed on one surface of one of the plurality of baffle plates.

The canister may further include a supporter that is formed through the plurality of baffle plates so as to support the plurality of baffle plates, wherein the supporter may be formed through the one or more level sensors.

The canister may further include an inlet conduit that is connected to the accommodation portion and extends in the accommodation portion in order to introduce carrier gas into the accommodation portion, wherein the inlet conduit may be formed through the one or more level sensors.

Another aspect of the present invention provides a vapor deposition apparatus for performing a deposition process on a substrate, the vapor deposition apparatus including, a canister including an accommodation portion for accommodating a liquid material, an outlet conduit that is connected to the accommodation portion so as to discharge a gas material obtained by vaporizing the liquid material, a blocking cover that is connected to an upper surface of the accommodation portion, a plurality of baffle plates that are disposed in the accommodation portion and are spaced apart from each other, and a restrictor including a main body member that is disposed between the plurality of baffle plates and the blocking member and is connected to an internal side surface of the accommodation portion, an extension member extending from the main body member, and a through portion that is formed through the main body member and the extension member; and a deposition module including one or more injection portions that are connected to the outlet conduit of the canister and inject a raw material to a substrate, wherein the deposition module and the canister are configured to move together with respect to the substrate to perform the deposition process while being relatively moved with respect to the substrate.

The canister may be moved while being fixed to the deposition module.

The outlet conduit may be formed of a metal material.

The vapor deposition apparatus may be an atomic layer deposition (ALD) apparatus.

The substrate may be fixed and the deposition module and the canister perform the deposition process while being moved.

Still another aspect of the present invention provides a method of forming a thin film on a target deposition member by using a vapor deposition apparatus, the method includes: providing a vapor deposition apparatus including: a canister including an accommodation portion for accommodating a liquid material, an outlet pipe that is connected to the accommodation portion so as to discharge a gas material obtained by vaporizing the liquid material, a blocking cover that is connected to an upper surface of the accommodation portion, a plurality of baffle plates that are disposed in the accommodation portion and are spaced apart from each other, and a restrictor including a main body member that is disposed between the plurality of baffle plates and the blocking member and is connected to an internal side surface of the accommodation portion, an extension member extending from the main body member, and a through portion that is formed through the main body member and the extension member; and a deposition module including one or more injection portions that are connected to the outlet portion of the canister and inject a raw material into the substrate; and forming a thin film on a target deposition member while relatively moving the target deposition member with respect to the vapor deposition apparatus.

A further aspect of the present invention provides a method of manufacturing an organic light emitting display apparatus including a thin film over a substrate by using a vapor deposition apparatus, wherein the thin film includes at least a first electrode, an intermediate layer including an organic light emitting layer, a second electrode, and an encapsulation layer, the method comprising: providing a vapor deposition apparatus including a canister including an accommodation portion for accommodating a liquid material, an outlet conduit that is connected to the accommodation portion so as to discharge a gas material obtained by vaporizing the liquid material, a blocking cover that is connected to an upper surface of the accommodation portion, a plurality of baffle plates that are disposed in the accommodation portion and are spaced apart from each other, and a restrictor including a main body member that is disposed between the plurality of baffle plates and the blocking member and is connected to an internal side surface of the accommodation portion, an extension member extending from the main body member, and a through portion that is formed through the main body member and the extension member; and a deposition module including one or more injection portions that are connected to the outlet conduit of the canister and inject a raw material into the substrate; and forming a thin film over a substrate while relatively moving the substrate with respect to the vapor deposition apparatus.

The forming of the thin film may include forming an encapsulation layer disposed over a second electrode.

The forming of the thin film may include forming an insulation layer.

The forming of the thin film may include forming a conductive layer.

The substrate may be fixed and the deposition module and the canister perform the deposition process while being moved together.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF EMBODIMENTS

Hereinafter, embodiments of the present invention will be described with reference to the attached drawings.

Figure 1:
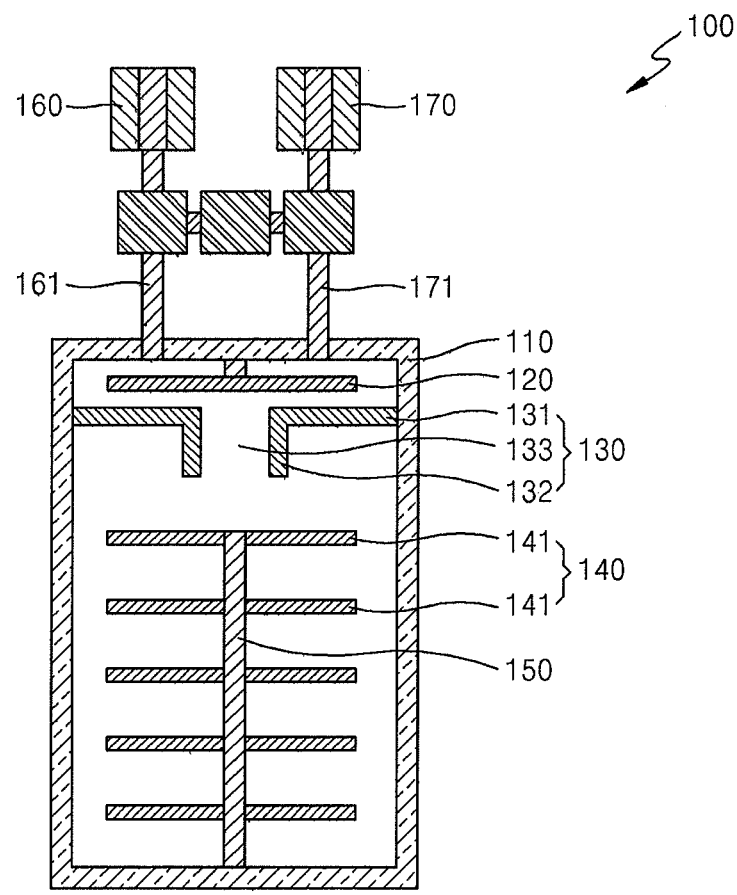
FIG. 1 is a cross-sectional view of a canister according to an embodiment of the present invention.
Figure 2:
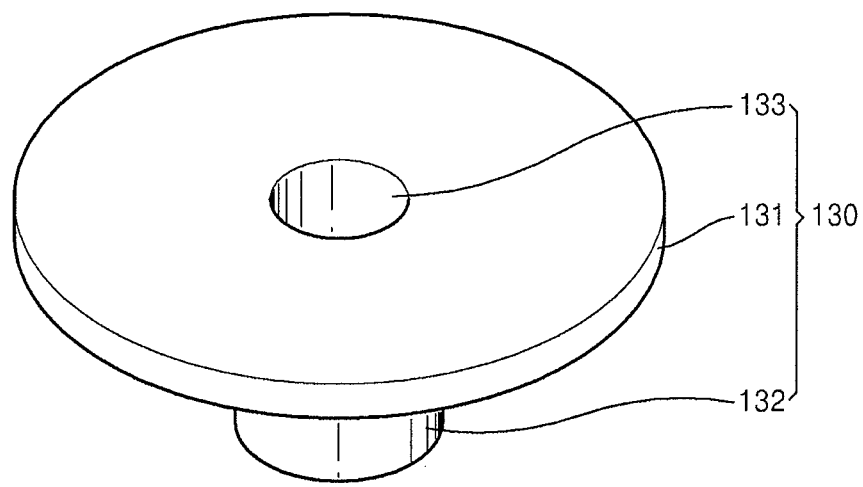
FIG. 2 is a magnified perspective view of a restrictor of FIG. 1.

FIG. 1 is a cross-sectional view of a canister 100 according to an embodiment of the present invention. FIG. 2 is a magnified perspective view of a restrictor 130 of FIG. 1.

Referring to FIGS. 1 and 2, the canister 100 includes an accommodation portion 110, a blocking member 120, the restrictor 130, a baffle structure 140, a supporting portion 150, an inlet portion 160, and an outlet portion 170.

The accommodation portion 110 includes a wall defining a chamber which is a space for accommodating a liquid material (not shown) therein. The accommodation portion 110 may be formed of a material having excellent durability so as to effectively accommodate a liquid material (not shown). For example, the accommodation portion 110 may be formed of a stainless steel material. Although not shown, the accommodation portion 110 may include an injection port (not shown) for injecting a liquid material. Alternatively, the accommodation portion 110 may have an openable and closable upper portion such that a liquid material may be easily injected into the accommodation portion 110.

A heater (not shown) may be disposed adjacent to the accommodation portion 110 or may be integrated with the accommodation portion 110 so as to heat a liquid material (not shown) accommodated in the accommodation portion 110 to change the liquid material to a vapor state.

The inlet portion 160 injects carrier gas into the accommodation portion 110. The carrier gas includes inert gas. The inlet portion 160 includes an inlet conduit or pipe 161 connected to the accommodation portion 110. The inlet pipe 161 may extend a long way but may not extend to an internal space of the accommodation portion 110.

The outlet portion 170 discharges a gas material, which is formed by changing a liquid material (not shown) stored in the accommodation portion 110 to a vapor state, into a deposition space of a vapor deposition apparatus (not shown). The outlet portion 170 includes an outlet conduit or pipe 171 that is connected to the accommodation portion 110.

In detail, a liquid material (not shown) stored in the accommodation portion 110 is heated by the heater (not shown) and is changed to a vapor state. The gas material in the accommodation portion 110 easily moves to a reaction space of the vapor deposition apparatus (not shown) through the outlet pipe 171 via the carrier gas that is injected into the accommodation portion 110 through the inlet pipe 161 of the inlet portion 160.

The blocking cover or blocking member 120 is connected and fixed to an upper surface of the accommodation portion 110 and is formed to have a similar shape to a plate shape.

The blocking member 120 is spaced apart from at least a portion of the upper surface of the accommodation portion 110. In detail, the blocking member 120 is spaced apart from portions of the upper surface of the accommodation portion 110, which corresponds to the inlet pipe 161 and the outlet pipe 171. In addition, the blocking member 120 is spaced apart from an internal side surface of the accommodation portion 110.

Thus, when the carrier gas is injected into the accommodation portion 110 through the inlet pipe 161, the carrier gas can flow around the blocking member 120, and through a space between the blocking member 120 and the internal side surface. In addition, when the gas material is discharged through the outlet pipe 171, the gas material can flow around the blocking member 120, and through a space between the blocking member 120 and the internal side surface.

The blocking member 120 may easily prevent a liquid material (not shown) stored in the accommodation portion 110 from being discharged through the outlet pipe 171. To this end, the blocking member 120 extends a long way to reach a region near the outlet pipe 171 of the outlet portion 170. When the vapor deposition apparatus (not shown) supplies a gas material, if an unwanted liquid material is injected through the outlet pipe 171, the gas material is not smoothly injected to the vapor deposition apparatus (not shown), thereby reducing an efficiency of a deposition procedure. According to the present embodiment, the blocking member 120 extends a long way to reach a region corresponding to the outlet pipe 171, thereby preventing a liquid material from being introduced into the outlet pipe 171.

In addition, the blocking member 120 may easily prevent a liquid material (not shown) stored in the accommodation portion 110 from being introduced into the inlet pipe 161. To this end, the blocking member 120 extends a long way to reach a region corresponding to the inlet pipe 161 of the inlet portion 160. When the liquid material is introduced into the inlet pipe 161, the carrier gas is not smoothly injected through the inlet pipe 161. If the carrier gas is not smoothly injected, a vaporized gas material in the accommodation portion 110 is not smoothly injected to the vapor deposition apparatus (not shown) through the outlet pipe 171, thereby reducing an efficiency of a deposition procedure. According to the present invention, the blocking member 120 extends a long way to reach a region corresponding to the inlet pipe 161, thereby preventing the carrier gas from being introduced into the inlet pipe 161.

The restrictor 130 is disposed in the accommodation portion 110 and is disposed below the blocking member 120. The restrictor 130 includes a main wall member or main body member 131, an extension member 132, and a through portion or a passage 133.

As shown in FIGS. 1 and 2, the main body member 131 is formed to have a plate shape. The main body member 131 may be connected to the internal side surface of the accommodation portion 110. In embodiments, the main wall member 131 can partition the interior chamber of the accommodation portion into an upper space accommodating the blocking member and a lower space accommodating a plurality of baffle plates 141. Due to the main body member 131, the restrictor 130 is stably disposed in the accommodation portion 110. In detail, the main body member 131 may be tightly attached to the internal side surface of the accommodation portion 110. Thus, a liquid material contained in the lower space of the chamber is prevented from moving beyond the main body member 131 along the internal side surface of the accommodation portion 110.

As shown in FIG. 2, the main body member 131 may be formed to have a circular plate shape. However, the present invention is not limited thereto and the shape of the main body member 131 may be changed according to the shape of the accommodation portion 110.

In embodiments, the cylindrical extension member 132 may extend from the main body member 131 in one direction. In detail, the extension member 132 extends from the main body member 131 in a direction away from the blocking member 120.

The through portion 133 may be formed through the main body member 131 and the extension member 132. Spaces in the accommodation portion 110 are connected to each other from a lower portion of the restrictor 130 to an upper portion through the through portion 133. That is, the space in the accommodation portion 110 is divided into upper and lower spaces of the restrictor 130, based on the restrictor 130. The upper and lower spaces in the accommodation portion 110 are connected to each other through the through portion 133. The spaces in the accommodation portion 110 are restrictedly connected to each other through the through portion 133.

Thus, movement of a liquid material (not shown) in the accommodation portion 110 is limited and only a vapor material obtained by vaporizing the liquid material moves towards the outlet pipe 171 through the through portion 133.

In detail, the liquid material in the accommodation portion 110 moves within the accommodation portion 110 when the accommodation portion 110 shakes or moves. In particular, when the accommodation portion 110 moves, the liquid material in the accommodation portion 110 may move and may be introduced into the outlet pipe 171. However, according to the present embodiment, even if the accommodation portion 110 shakes and the liquid material moves, the liquid material is prevented from moving towards the outlet pipe 171 by the restrictor 130. In detail, the main body member 131 is formed to be connected to the internal side surface of the accommodation portion 110 to primarily prevent the liquid material from moving upwards and to secondarily prevent the liquid material from moving towards the extension member 132 that extends downward a long way.

The baffle structure 140 includes a plurality of baffle plates or baffle plates 141. The baffle plates 141 are spaced apart from each other. The baffle plates 141 may be disposed in the accommodation portion 110 and may be spaced apart from the internal side surface of the accommodation portion 110. The baffle structure 140 may primarily limit movement of the liquid material stored in the accommodation portion 110. That is, when the accommodation portion 110 shakes, the baffle structure 140 may prevent the liquid material from unstably moving to stably store the liquid material in the accommodation portion 110.

The supporting portion 150 is disposed in the accommodation portion 110 and supports the baffle structure 140. In detail, the supporting portion 150 has a column shape and is formed through the baffle plates 141 of the baffle structure 140 to support the baffle plates 141. The supporting portion 150 may be tightly attached to a bottom surface of the accommodation portion 110 so as to be stably disposed in the accommodation portion 110.

According to the present embodiment, the canister 100 includes the blocking member 120 connected to the upper surface of the accommodation portion 110. The blocking member 120 is spaced apart from a portion of the upper surface of the accommodation portion 110 and extends a long way to reach portions corresponding to the outlet pipe 171 and the inlet pipe 161. Thus, the liquid material is prevented from being introduced into the outlet pipe 171 and the inlet pipe 161, thereby increasing the efficiency of a deposition procedure and enhancing the characteristics of a deposition layer.

In addition, the canister 100 includes the restrictor 130. The space in the accommodation portion 110 may be divided into a lower space and an upper space based on the restrictor 130. The upper space and the lower space in the accommodation portion 110 are restrictedly connected through the through portion 133 to prevent the liquid material in the accommodation portion 110 from moving above the restrictor 130. Thus, only a material in a desired gas state may be discharged by preventing the liquid material from being discharged through the outlet pipe 171, thereby increasing the efficiency of a deposition procedure during a vapor deposition method using the canister 100 and maintaining the characteristics of a deposition layer.

The canister 100 includes the baffle structure 140 that prevents the liquid material in the accommodation portion 110 from moving.

Figure 3:
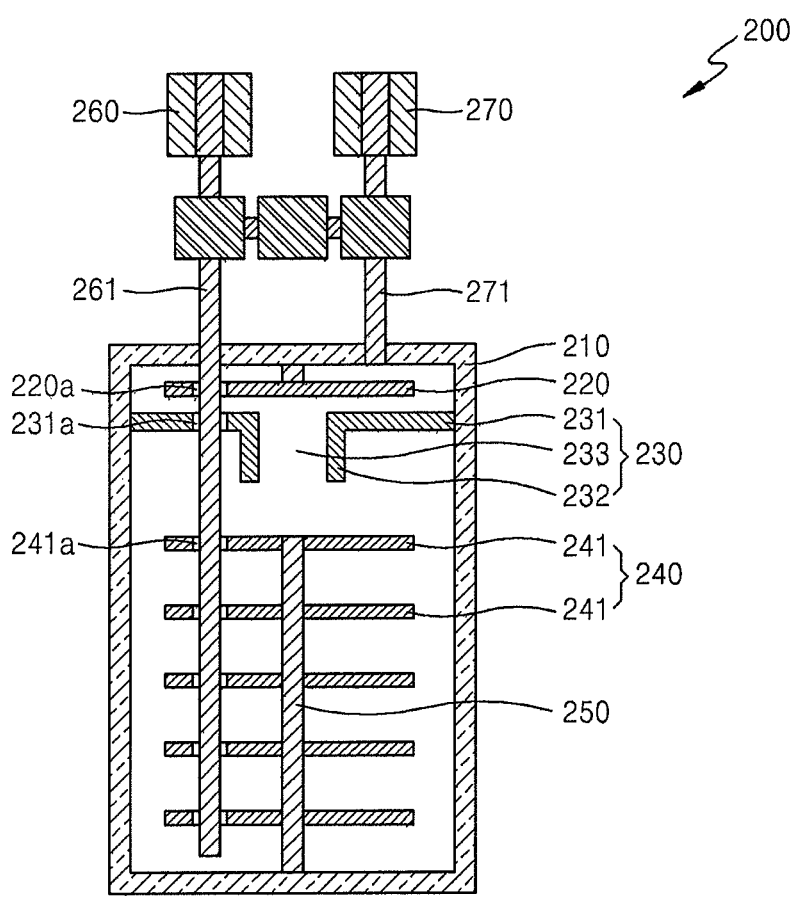
FIG. 3 is a cross-sectional view of a canister according to another embodiment of the present invention.

FIG. 3 is a cross-sectional view of a canister 200 according to another embodiment of the present invention.

Referring to FIG. 3, the canister 200 includes an accommodation portion 210, a blocking member 220, a restrictor 230, a baffle structure 240, a supporting portion 250, an inlet portion 260, and an outlet portion 270. For convenience of description, the present embodiment will be described in terms of features different from those of the previous embodiment.

The accommodation portion 210 is a space for accommodating a liquid material (not shown). The accommodation portion 210 may be formed of a metal material having excellent durability so as to effectively accommodate a liquid material (not shown). Although not shown, the accommodation portion 210 may include an injection port (not shown) for injecting a liquid material. Alternatively, the accommodation portion 210 may have an openable and closable upper portion such that a liquid material may be easily injected into the accommodation portion 210.

A heater (not shown) may be disposed adjacent to the accommodation portion 210 or may be integrated with the accommodation portion 210 so as to heat a liquid material (not shown) accommodated in the accommodation portion 210 to change the liquid material to a vapor state.

The inlet portion 260 injects carrier gas into the accommodation portion 210. The inlet portion 260 includes an inlet pipe 261 connected to the accommodation portion 210. The inlet pipe 261 may extend a long way into a lower space of the accommodation portion 210. To this end, the inlet pipe 261 is formed through the blocking member 220, the restrictor 230, and the baffle structure 240. The inlet pipe 261 extends a long way to effectively supply the carrier gas. In particular, when a vapor pressure of the liquid material stored in the accommodation portion 210 is low, the inlet pipe 261 may extend such that an end of the inlet pipe 261 may be immersed in the material liquid in the accommodation portion 210. Thus, the liquid material accommodated in the accommodation portion 210 may be effectively vaporized.

The outlet portion 270 discharges a gas material, which is formed by changing a liquid material (not shown) stored in the accommodation portion 210 to a vapor state, into a deposition space of a vapor deposition apparatus (not shown). The outlet portion 270 includes an outlet pipe 271 that is connected to the accommodation portion 210.

In detail, a liquid material (not shown) stored in the accommodation portion 210 is heated by the heater (not shown) and is changed to a vapor state. The gas material in the accommodation portion 210 easily moves to a reaction space of the vapor deposition apparatus (not shown) through the outlet pipe 271 via the carrier gas that is injected into the accommodation portion 210 through the inlet pipe 261 of the inlet portion 260.

The blocking cover or blocking member 220 is connected and fixed to an upper surface of the accommodation portion 210 and is formed to have a similar shape to a plate shape.

The blocking member 220 is spaced apart from at least a portion of the upper surface of the accommodation portion 210. In detail, the blocking member 220 is spaced apart from a portion of the upper surface of the accommodation portion 210, which corresponds to the outlet pipe 271. In addition, the blocking member 220 is spaced apart from an internal side surface of the accommodation portion 210.

Thus, when the vapor material is discharged through the outlet pipe 271, the vapor material can go around the blocking member 220, and flow through a space between the blocking member 220 and the internal side surface and around the blocking member 220.

In addition, the blocking member 220 may easily prevent a liquid material (not shown) stored in the accommodation portion 210 from being discharged through the outlet pipe 271. To this end, the blocking member 220 extends a long way to reach a portion corresponding to the outlet pipe 271 of the outlet portion 270. When the vapor deposition apparatus (not shown) supplies a gas material, if an unwanted liquid material is injected through the outlet pipe 271, the gas material is not smoothly injected to the vapor deposition apparatus (not shown), thereby reducing an efficiency of a deposition procedure. According to the present embodiment, the blocking member 220 extends a long way to reach a region corresponding to the outlet pipe 271, thereby preventing a liquid material from being introduced into the outlet pipe 271.

In addition, the blocking member 220 includes an opening 220a and the inlet pipe 261 extends a long way through the opening 220a of the blocking member 220.

The restrictor 230 is disposed in the accommodation portion 210 and is disposed below the blocking member 220. The restrictor 230 includes a main body member 231, an extension member 232, and a through portion 233.

The main body member 231 is formed to have a plate shape. The main body member 231 may be connected to an internal side surface of the accommodation portion 210. Thus, the restrictor 230 is stably disposed in the accommodation portion 210. In detail, the main body member 231 may be closely attached to the internal side surface of the accommodation portion 210. Thus, the liquid material contained in the lower space of the chamber is prevented from moving beyond the main body member 231 along the internal side surface of the accommodation portion 210.

The extension member 232 extends from the main body member 231 in one direction. In detail, the extension member 232 extends from the main body member 231 in a direction away from the blocking member 220.

The through portion 233 may be formed through the main body member 231 and the extension member 232. Spaces in the accommodation portion 210 are connected to each other from a lower portion of the restrictor 230 to an upper portion through the through portion 233.

That is, the space in the accommodation portion 210 is divided into upper and lower spaces of the restrictor 230, based on the restrictor 230. The upper and lower spaces in the accommodation portion 210 are connected to each other through the through portion 233. The spaces in the accommodation portion 210 are restrictedly connected to each other through the through portion 233.

Thus, movement of a liquid material (not shown) in the accommodation portion 210 is limited and only a vapor material obtained by vaporizing the liquid material moves towards the outlet pipe 271 through the through portion 233.

In detail, the liquid material in the accommodation portion 210 moves in the accommodation portion 210 when the accommodation portion 210 shakes or moves. In particular, when the accommodation portion 210 moves, the liquid material in the accommodation portion 210 may move and may be introduced into the outlet pipe 271. However, according to the present embodiment, even if the accommodation portion 210 shakes and the liquid material moves, the liquid material is prevented from moving towards the outlet pipe 271 by the restrictor 230. In detail, the main body member 231 is formed to be connected to the internal surface of the accommodation portion 210 to primarily prevent the liquid material from moving upwards and to secondarily prevent the liquid material from moving towards the through portion 233 that extends downwards a long way.

The restrictor 230 includes an opening 230a and the inlet pipe 261 extends a long way through the opening 230a of the restrictor 230.

The baffle structure 240 includes a plurality of baffle plates 241. The baffle plates 241 are spaced apart from each other. The baffle plates 241 may be disposed in the accommodation portion 210 and may be spaced apart from the internal side surface of the accommodation portion 210. The baffle structure 240 limits movement of the liquid material stored in the accommodation portion 210. That is, when the accommodation portion 210 shakes, the baffle plates 241 may prevent the liquid material from unstably moving to stably store the liquid material in the accommodation portion 210.

The supporting portion 250 is disposed in the accommodation portion 210 and supports the baffle structure 240. In detail, the supporting portion 250 has a column shape and is formed through the baffle plates 241 of the baffle structure 240 to support the baffle plates 241. The supporting portion 250 may be tightly attached to a bottom surface of the accommodation portion 210 so as to be stably disposed in the accommodation portion 210.

In addition, each baffle plate 241 of the baffle structure 240 includes an opening 241a and the inlet pipe 261 extends a long way through the opening 241a of the baffle plate 241.

According to the present embodiment, the canister 200 includes the blocking member 220 that is connected to the upper surface of the accommodation portion 210. The blocking member 220 is spaced apart from portions of the upper surface of the accommodation portion 210 and extends a long way to portions corresponding to the outlet pipe 271 and the inlet pipe 261. Thus, the liquid material is prevented from being introduced into the outlet pipe 271 and the inlet pipe 261, thereby increasing the efficiency of a deposition procedure and enhancing characteristic of a deposition layer.

In addition, the canister 200 includes the restrictor 230. The space in the accommodation portion 210 may be divided into a lower space and an upper space based on the restrictor 230. The upper space and the lower space in the accommodation portion 210 are connected to each other through the through portion 233, thereby preventing the liquid material in the accommodation portion 210 from moving above the restrictor 230. Thus, only a material in a desired state required for a deposition process may be discharged by preventing a liquid material from being discharged through the outlet pipe 271, thereby increasing the efficiency of a deposition procedure during a vapor deposition method using the canister 200 and maintaining the characteristics of a deposition layer.

The canister 200 includes the baffle structure 240 that prevents the liquid material in the accommodation portion 210 from moving.

In addition, according to the present embodiment, the inlet portion 260 for injecting the carrier gas extends a long way to a lower space of the accommodation portion 210. Thus, an amount of the carrier gas introduced into the accommodation portion 210 may be increased and a vaporized material in the accommodation portion 210 may be easily discharged through the outlet pipe 271 via the carrier gas. In particular, when a vapor pressure of the liquid material stored in the accommodation portion 210 is low, a vaporization efficiency of a liquid material and the discharging characteristics of the vaporized material may be increased.

In this case, the inlet pipe 261 is formed through the opening 220a of the blocking member 220, the opening 230a of the restrictor 230, and openings 241a of the baffle plates 241 and is supported by the blocking member 220, the restrictor 230, and the baffle plates 241. In order to prevent a liquid material from moving, the inlet pipe 261 may be tightly attached to the opening 220a of the blocking member 220, the opening 230a of the restrictor 230, and the openings 241a of the baffle plates 241.

Figure 4:
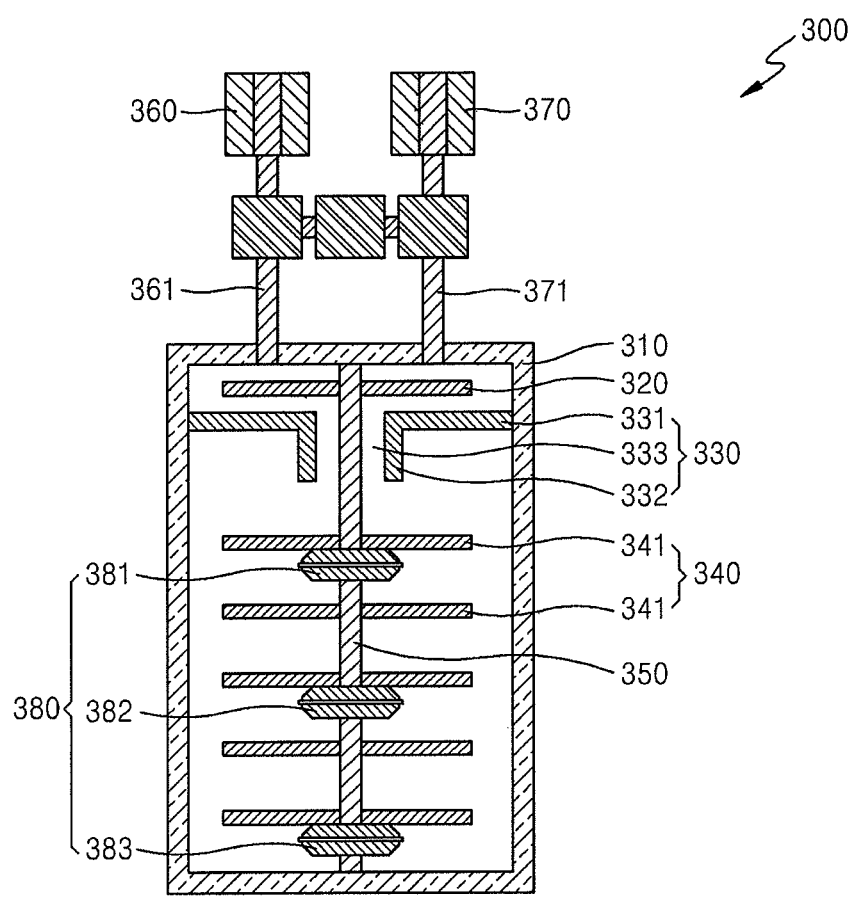
FIG. 4 is a cross-sectional view of a canister according to another embodiment of the present invention.

FIG. 4 is a cross-sectional view of a canister 300 according to another embodiment of the present invention.

Referring to FIG. 4, the canister 300 includes an accommodation portion 310, a blocking member 320, a restrictor 330, a baffle structure 340, a supporting portion 350, an inlet portion 360, an outlet portion 370, and a sensor portion 380.

For convenience of description, the present embodiment will be described in terms of features different from those of the previous embodiment.

The accommodation portion 310 is a space for accommodating a liquid material (not shown). The accommodation portion 310 may be formed of a metal material having excellent durability so as to effectively accommodate a liquid material (not shown). Although not shown, the accommodation portion 310 may include an injection port (not shown) for injecting a liquid material. Alternatively, the accommodation portion 310 may have an openable and closable upper portion such that a liquid material may be easily injected into the accommodation portion 310.

A heater (not shown) may be disposed adjacent to the accommodation portion 310 or may be integrated with the accommodation portion 310 so as to heat a liquid material (not shown) accommodated in the accommodation portion 310 to change the liquid material to a vapor state.

The inlet portion 360 injects carrier gas into the accommodation portion 310. The inlet portion 360 includes an inlet pipe 361 connected to the accommodation portion 310.

The outlet portion 370 discharges a gas material, which is formed by changing a liquid material (not shown) stored in the accommodation portion 310 to a vapor state, into a deposition space of a vapor deposition apparatus (not shown). The outlet portion 370 includes an outlet pipe 371 that is connected to the outlet pipe 371.

In detail, a liquid material (not shown) stored in the accommodation portion 310 is heated by the heater (not shown) and is changed to a vapor state. The gas material in the accommodation portion 310 easily moves to a reaction space of the vapor deposition apparatus (not shown) through the outlet pipe 371 via the carrier gas that is injected into the accommodation portion 310 through the inlet pipe 361 of the inlet portion 360.

The blocking member 320 is connected and is fixed to an upper surface of the accommodation portion 310 and is formed to have a similar shape to a plate shape.

The blocking member 320 is spaced apart from at least a portion of the upper surface of the accommodation portion 310. In detail, the blocking member 320 is spaced apart from portions of the upper surface of the accommodation portion 310, which correspond to the outlet pipe 371 and the inlet pipe 361. In addition, the blocking member 320 is spaced apart from an internal side surface of the accommodation portion 310.

Thus, when the vapor material is discharged through the outlet pipe 371, the vapor material can flow around the blocking member 320 and through a space between the blocking member 320 and the internal side surface. In addition, when the carrier gas is introduced into the accommodation portion 310 through the inlet pipe 361, the carrier gas can flow around the blocking member 320 and through a space between the blocking member 320 and the internal side surface.

The blocking member 320 may easily inhibit a liquid material (not shown) stored in the accommodation portion 310 from being discharged through the outlet pipe 371. To this end, the blocking member 320 extends a long way to a region corresponding to the outlet pipe 371 of the outlet portion 370. When the vapor deposition apparatus (not shown) supplies a gas material, if an unwanted liquid material is injected through the outlet pipe 371, the gas material is not smoothly injected to the vapor deposition apparatus (not shown), thereby reducing the efficiency of a deposition procedure. According to the present embodiment, the blocking member 320 extends a long way to reach a region corresponding to the outlet pipe 371, thereby preventing the liquid material from being introduced into the outlet pipe 371.

The restrictor 330 is disposed in the accommodation portion 310 and is disposed below the blocking member 320. The restrictor 330 includes a main body member 331, an extension member 332, and a through portion 333.

The main body member 331 is formed to have a plate shape. The main body member 331 may be connected to an internal side surface of the accommodation portion 310. Thus, the restrictor 330 is stably disposed in the accommodation portion 310. In detail, the main body member 331 may be tightly attached to the internal side surface of the accommodation portion 310. Thus, the liquid material contained in the lower space is prevented from moving beyond the main body member 331 along the internal side surface of the accommodation portion 310.

The extension member 332 extends from the main body member 331 in one direction. In detail, the extension member 332 extends from the main body member 331 in a direction away from the blocking member 320.

The through portion 333 may be formed through the main body member 331 and the extension member 332. Spaces in the accommodation portion 310 are connected to each other from a lower portion of the restrictor 330 to an upper portion through the through portion 333.

That is, the space in the accommodation portion 310 is divided into upper and lower spaces of the restrictor 330, based on the restrictor 330. The upper and lower spaces in the accommodation portion 310 are connected to each other through the through portion 333. The spaces in the accommodation portion 310 are restrictedly connected to each other through the through portion 333.

Thus, movement of a liquid material (not shown) in the accommodation portion 310 is limited and only a vapor material obtained by vaporizing the liquid material moves towards the outlet pipe 371 through the through portion 333.

In detail, the liquid material in the accommodation portion 310 moves in the accommodation portion 310 when the accommodation portion 310 shakes or moves. In particular, when the accommodation portion 310 moves, the liquid material in the accommodation portion 310 may move and may be introduced into the outlet pipe 371. However, according to the present embodiment, even if the accommodation portion 310 shakes and the liquid material moves, the liquid material is prevented from moving towards the outlet pipe 371 by the restrictor 330. In detail, the main body member 331 is formed to be connected to the internal side surface of the accommodation portion 310 to primarily prevent the liquid material from moving upwards and to secondarily prevent the liquid material from moving towards the through portion 333 that extends a long way downwards.

The baffle structure 340 includes a plurality of baffle plates 341. The baffle plates 341 are spaced apart from each other. The baffle plates 341 may be disposed in the accommodation portion 310 and may be spaced apart from the internal surface of the accommodation portion 310. The baffle structure 340 limits movement of the liquid material stored in the accommodation portion 310. That is, when the accommodation portion 310 shakes, the baffle plates 341 may prevent the liquid material from unstably moving to stably store the liquid material in the accommodation portion 310.

The supporting portion 350 is disposed in the accommodation portion 310 and supports the baffle structure 340. In detail, the supporting portion 350 has a column shape and is formed through the baffle plates 341 of the baffle structure 340 to support the baffle plates 341. The supporting portion 350 may be tightly attached to a bottom surface of the accommodation portion 310 so as to be stably disposed in the accommodation portion 310.

In addition, the supporting portion 350 may selectively extend a long way and may be connected to the blocking member 320. Thus, the baffle structure 340 may effectively fix and the blocking member 320 in the accommodation portion 310. In addition, the supporting portion 350 may further prevent the liquid material in the accommodation portion 310 from passing through the through portion 333 of the restrictor 330. Of course, the canisters 100 and 200 according to the above-described embodiments and a canister 400 described later may be configured in such a way that a supporting portion may be connected to a blocking member.

The sensor portion 380 is disposed in the accommodation portion 310 and measures an amount of the remaining liquid material accommodated in the accommodation portion 310. To this end, the sensor portion 380 includes a plurality of level sensors 381, 382, and 383, in detail, an upper level sensor 381, an intermediate level sensor 382, and a lower level sensor 383. The level sensors 381, 382, and 383 may be attached to surfaces of the baffle plates 341. FIG. 4 shows only three level sensors 381, 382, and 383, but the number of the level sensors may be changed according to the accuracy required for measuring the amount of the remaining liquid material.

The level sensors 381, 382, and 383 may be connected to the supporting portion 350. In detail, the supporting portion 350 may be formed through the level sensors 381, 382, and 383. Thus, the level sensors 381, 382, and 383 may be effectively fixed and may accurately measure the amount of the remaining liquid material.

Thus, a point of time for adding a liquid material of the accommodation portion 310 may be accurately recognized.

The canister 300 includes the blocking member 320 that is connected to the upper surface of the accommodation portion 310. The blocking member 320 is spaced apart from portions of the upper surface of the accommodation portion 310 and extends a long way to portions corresponding to the outlet pipe 371 and the inlet pipe 361. Thus, the liquid material is prevented from being introduced into the outlet pipe 371 and the inlet pipe 361, thereby increasing the efficiency of a deposition procedure and enhancing characteristic of a deposition layer.

In addition, the canister 300 includes the restrictor 330. The space in the accommodation portion 310 may be divided into a lower space and an upper space based on the restrictor 330. The upper space and the lower space in the accommodation portion 310 are connected to each other through the through portion 333, thereby preventing the liquid material in the accommodation portion 310 from moving above the restrictor 330. Thus, only a material in a desired state required for a deposition process may be discharged by preventing a liquid material from being discharged through the outlet pipe 371, thereby increasing the efficiency of a deposition procedure during a vapor deposition method using the canister 300 and maintaining the characteristics of a deposition layer.

The canister 300 includes the baffle structure 340 that prevents the liquid material in the accommodation portion 310 from moving.

In addition, according to the present embodiment, the sensor portion 380 may be disposed in the accommodation portion 310 so as to easily recognize the amount of the remaining liquid material.

Figure 5:
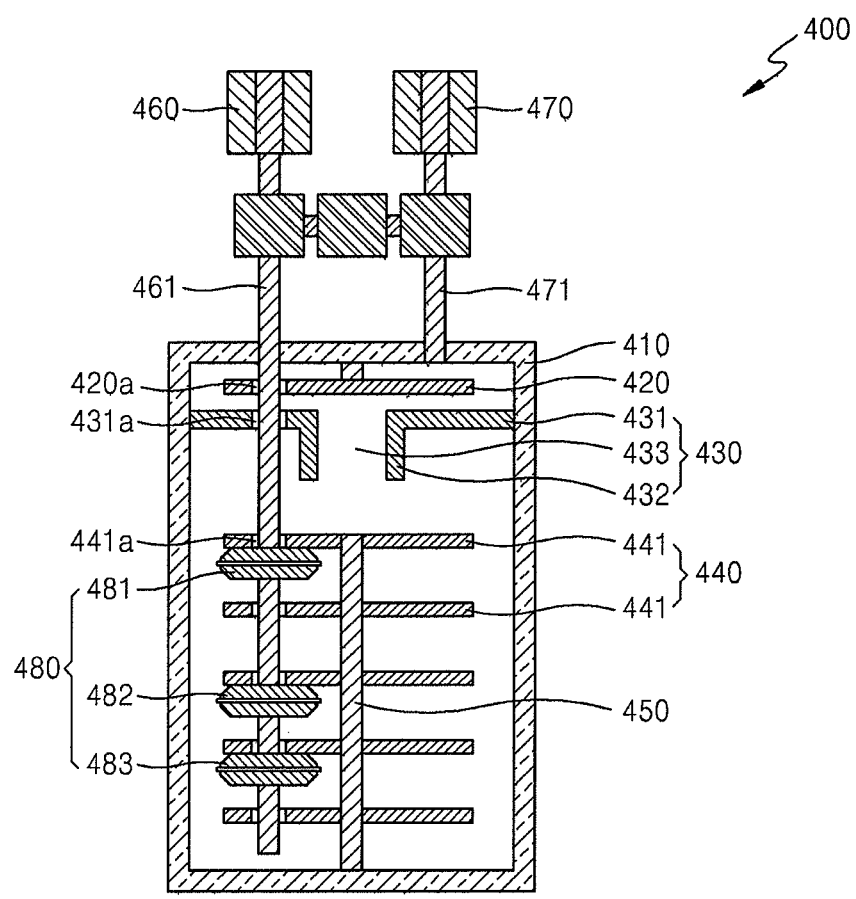
FIG. 5 is a cross-sectional view of a canister according to another embodiment of the present invention.

FIG. 5 is a cross-sectional view of a canister 400 according to another embodiment of the present invention.

Referring to FIG. 5, the canister 400 includes an accommodation portion 410, a blocking member 420, a restrictor 430, a baffle structure 440, a supporting portion 450, an inlet portion 460, an outlet portion 470, and a sensor portion 480. For convenience of description, the present embodiment will be described in terms of features different from those of the previous embodiment.

The accommodation portion 410 is a space for accommodating a liquid material (not shown). The accommodation portion 410 may be formed of a metal material having excellent durability so as to effectively accommodate a liquid material (not shown). Although not shown, the accommodation portion 410 may include an injection port (not shown) for injecting a liquid material. Alternatively, the accommodation portion 410 may have an openable and closable upper portion such that a liquid material may be easily injected into the accommodation portion 410.

A heater (not shown) may be disposed adjacent to the accommodation portion 410 or may be integrated with the accommodation portion 410 so as to heat a liquid material (not shown) accommodated in the accommodation portion 410 to change the liquid material to a vapor state.

The inlet portion 460 injects carrier gas into the accommodation portion 410. The inlet portion 460 includes an inlet pipe 461 connected to the accommodation portion 410. The inlet pipe 461 may extend a long way to a lower space of the accommodation portion 410. To this end, the inlet pipe 461 is formed through the blocking member 420, the restrictor 430, and the baffle structure 440. The inlet pipe 461 extends a long way to effectively supply the carrier gas. In particular, when a vapor pressure of the liquid material stored in the accommodation portion 410 is low, the inlet pipe 461 may extend such that an end of the inlet pipe 461 may be immersed in the liquid material in the accommodation portion 410.

The outlet portion 470 discharges a gas material, which is formed by changing a liquid material (not shown) stored in the accommodation portion 410 to a vapor state, into a deposition space of a vapor deposition apparatus (not shown). The outlet portion 470 includes an outlet pipe 471 that is connected to the accommodation portion 410.

In detail, a liquid material (not shown) stored in the accommodation portion 410 is heated by the heater (not shown) and is changed to a vapor state. The gas material in the accommodation portion 410 easily moves to a reaction space of the vapor deposition apparatus (not shown) through the outlet pipe 471 via the carrier gas that is injected into the accommodation portion 410 through the inlet pipe 461 of the inlet portion 460.

The blocking member 420 is connected and fixed to an upper surface of the accommodation portion 410 and is formed to have a similar shape to a plate shape.

The blocking member 420 is spaced apart from at least a portion of the upper surface of the accommodation portion 410. In detail, the blocking member 420 is spaced apart from a portion of the upper surface of the accommodation portion 410, which corresponds to the outlet pipe 471. In addition, the blocking member 420 is spaced apart from an internal side surface of the accommodation portion 410.

Thus, when the vapor material is discharged through the outlet pipe 471, the vapor material can flow around the blocking member 420 and through a space between the blocking member 420 and the internal side surface.

In addition, the blocking member 420 may easily prevent a liquid material (not shown) stored in the accommodation portion 410 from being discharged through the outlet pipe 471. To this end, the blocking member 420 extends a long way to a portion corresponding to the outlet pipe 471 of the outlet portion 470. When the vapor deposition apparatus (not shown) supplies a gas material, if an unwanted liquid material is injected through the outlet pipe 471, the gas material is not smoothly injected to the vapor deposition apparatus (not shown), thereby reducing the efficiency of a deposition procedure. According to the present embodiment, the blocking member 420 extends a long way to reach a region corresponding to the outlet pipe 471, thereby preventing a liquid material from being introduced into the outlet pipe 471.

The blocking member 420 includes an opening 420a and the inlet pipe 461 extends a long way through the opening 420a of the blocking member 420.

The restrictor 430 is disposed in the accommodation portion 410 and is disposed below the blocking member 420. The restrictor 430 includes a main body member 431, an extension member 432, and a through portion 433.

The main body member 431 is formed to have a plate shape. The main body member 431 may be formed to be connected to the internal side surface of the accommodation portion 410. Thus, the restrictor 430 is stably disposed in the accommodation portion 410. In detail, the main body member 431 may be tightly attached to the internal side surface of the accommodation portion 410. Thus, the liquid material contained in the lower space is prevented from moving beyond the main body member 431 along the internal side surface of the accommodation portion 410.

The extension member 432 extends from the main body member 431 in one direction. In detail, the extension member 432 extends from the main body member 431 in a direction away from the blocking member 420.

The through portion 433 may be formed through the main body member 431 through the extension member 432. Spaces in the accommodation portion 410 are connected to each other from a lower portion of the restrictor 430 through the through portion 433.

That is, the space in the accommodation portion 410 is divided into upper and lower spaces of the restrictor 430, based on the restrictor 430. The upper and lower spaces in the accommodation portion 410 are connected to each other through the through portion 433. The spaces in the accommodation portion 410 are restrictedly connected to each other through the through portion 433.

Thus, movement of a liquid material (not shown) in the accommodation portion 410 is limited and only a vapor material obtained by vaporizing the liquid material moves towards the outlet pipe 471 through the through portion 433.

In detail, the liquid material in the accommodation portion 410 moves in the accommodation portion 410 when the accommodation portion 410 shakes or moves. In particular, when the accommodation portion 410 moves, the liquid material in the accommodation portion 410 may move and may be introduced into the outlet pipe 471. However, according to the present embodiment, even if the accommodation portion 410 shakes and the liquid material moves, the liquid material is prevented from moving towards the outlet pipe 471 by the restrictor 430. In detail, the main body member 431 is formed to be connected to the internal side surface of the accommodation portion 410 to primarily prevent the liquid material from moving upwards and to secondarily prevent the liquid material from moving towards the through portion 433 through the extension member 432 that extends a long way downwards.

The restrictor 430 includes an opening 430a and the inlet pipe 461 extends a long way through the opening 430a of the restrictor 430.

The baffle structure 440 includes a plurality of baffle plates 441. The baffle plates 441 are spaced apart from each other. The baffle plates 441 may be disposed in the accommodation portion 410 and may be spaced apart from the internal surface of the accommodation portion 410. The baffle structure 440 limits movement of the liquid material stored in the accommodation portion 410. That is, when the accommodation portion 410 shakes, the baffle structure 440 may prevent the liquid material from unstably moving to stably store the liquid material in the accommodation portion 410.

The supporting portion 450 is disposed in the accommodation portion 410 and supports the baffle structure 440. In detail, the supporting portion 450 has a column shape and is formed through the baffle plates 441 of the baffle structure 440 to support the baffle plates 441. The supporting portion 450 may be tightly attached to a bottom surface of the accommodation portion 410 so as to be stably disposed in the accommodation portion 410.

Each of the baffle plates 441 of the baffle structure 440 includes an opening 441a and the inlet pipe 461 extends a long way through openings 441a of the baffle plates 441.

The sensor portion 480 is disposed in the accommodation portion 410 and measures an amount of the remaining liquid material accommodated in the accommodation portion 410. To this end, the sensor portion 480 includes a plurality of level sensors 481, 482, and 483, in detail, an upper level sensor 481, an intermediate level sensor 482, and a lower level sensor 483. The level sensors 481, 482, and 483 may be tightly attached to surfaces of the baffle plates 441. FIG. 5 shows only three level sensors 481, 482, and 483, but the number of the level sensors may be changed according to the accuracy required for measuring the amount of the remaining liquid material.

The level sensors 481, 482, and 483 may be connected to the inlet pipe 461. In detail, the inlet pipe 461 may be formed through the level sensors 481, 482, and 483. Thus, the level sensors 481, 482, and 483 may be effectively fixed and may accurately measure the amount of the remaining liquid material.

Thus, a point of time for adding a liquid material of the accommodation portion 410 may be accurately recognized.

The canister 400 includes the blocking member 420 that is connected to the upper surface of the accommodation portion 410. The blocking member 420 is spaced apart from portions of the upper surface of the accommodation portion 410 and extends a long way to portions corresponding to the outlet pipe 471 and the inlet pipe 461. Thus, the liquid material is prevented from being introduced into the outlet pipe 471 and the inlet pipe 461, thereby increasing the efficiency of a deposition procedure and enhancing characteristic of a deposition layer.

In addition, the canister 400 includes the restrictor 430. The space in the accommodation portion 410 may be divided into a lower space and an upper space based on the restrictor 430. The upper space and the lower space in the accommodation portion 410 are connected to each other through the through portion 433, thereby preventing the liquid material in the accommodation portion 410 from moving above the restrictor 430. Thus, only a material in a desired state required for a deposition process may be discharged by preventing a liquid material from being discharged through the outlet pipe 471, thereby increasing the efficiency of a deposition procedure during a vapor deposition method using the canister 400 and maintaining the characteristics of a deposition layer.

The canister 400 includes the baffle structure 440 that prevents the liquid material in the accommodation portion 410 from moving.

In addition, according to the present embodiment, the inlet pipe 461 of the inlet portion 460 for injecting the carrier gas may extend to a lower space of the accommodation portion 410. Thus, an amount of the carrier gas introduced into the accommodation portion 410 may be increased and a vaporized material in the accommodation portion 410 may be easily discharged through the outlet pipe 471 via the carrier gas. In particular, when a vapor pressure of the liquid material stored in the accommodation portion 410 is low, a vaporization efficiency of a liquid material and the discharging characteristics of the vaporized material may be increased.

In this case, the inlet pipe 461 is formed through the opening 420a of the blocking member 420, the opening 430a of the restrictor 430, and the openings 441a of the baffle plates 441 and is stably supported by the blocking member 420, the restrictor 430, and the baffle plates 441. In order to prevent a liquid material from moving, the inlet pipe 461 may be tightly attached to the opening 420a of the blocking member 420, the opening 430a of the restrictor 430, and the openings 441a of the baffle plates 441.

In addition, according to the present embodiment, the sensor portion 480 may be disposed in the accommodation portion 410 so as to easily recognize the amount of the remaining liquid material.

Figure 6:
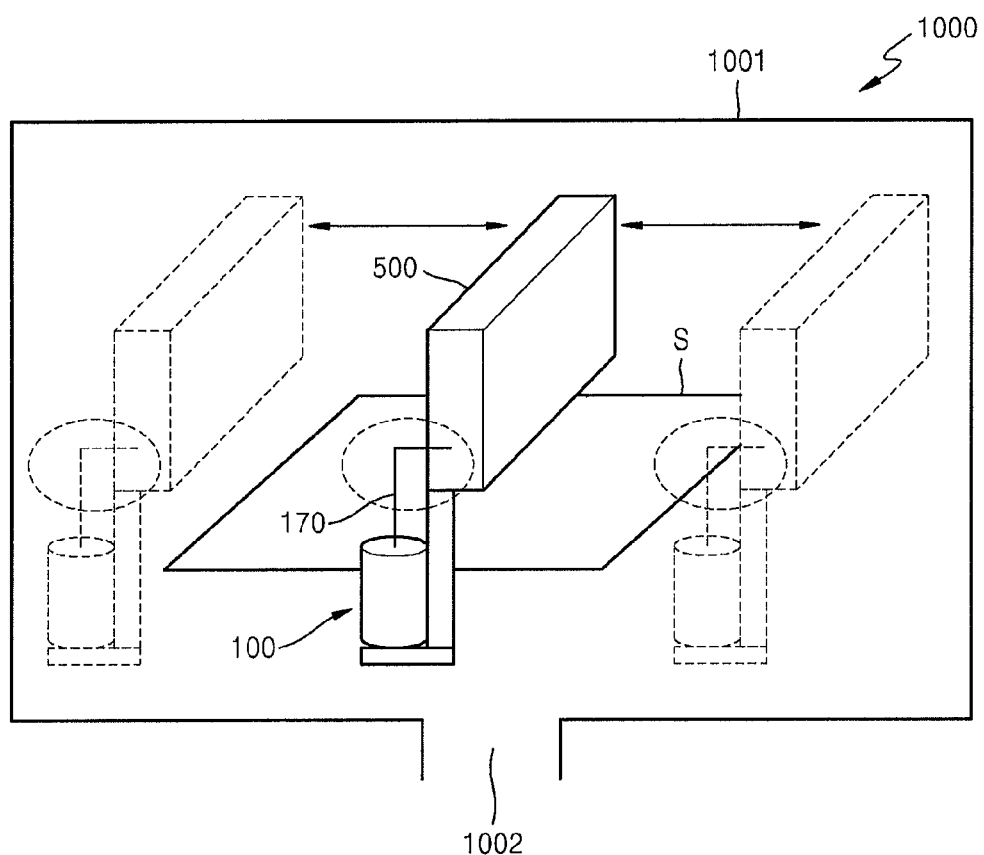
FIG. 6 is a diagram of a vapor deposition apparatus according to an embodiment of the present invention.
Figure 7:
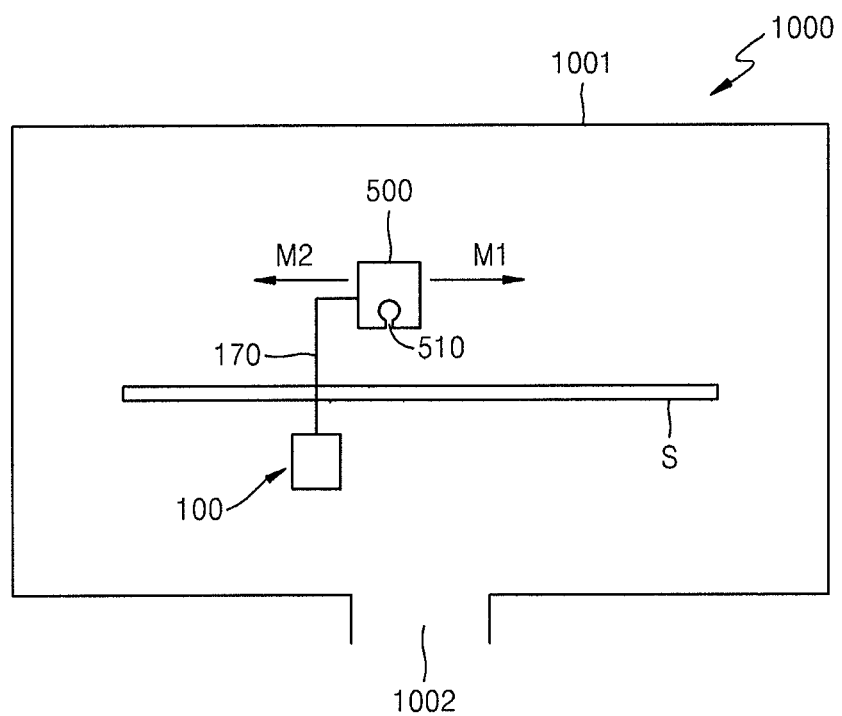
FIG. 7 is a schematic cross-sectional view of the vapor deposition apparatus of FIG. 6.

FIG. 6 is a diagram of a vapor deposition apparatus 1000 according to an embodiment of the present invention. FIG. 7 is a schematic cross-sectional view of the vapor deposition apparatus 1000 of FIG. 6.

The vapor deposition apparatus 1000 includes one or more deposition modules 500, canisters 100 that are respectively connected to the deposition modules 500, and a chamber 1001. Each of the canisters 100 is the same as the canister 100 shown in FIG. 1. Although not shown, of course, the vapor deposition apparatus 1000 may include the canisters 200, 300, and 400.

The vapor deposition apparatus 1000 may include the chamber 1001. The deposition modules 500 and the canisters 100 are disposed in the chamber 1001. A substrate S whereon a deposition process is performed by using the vapor deposition apparatus 1000 is disposed in the chamber 1001.

The chamber 1001 may include an exhaust portion 1002 formed through a lower portion of the chamber 1001. Impurity gas or remaining reaction gases are exhausted through the exhaust portion 1002.

A deposition module 500 includes one or more injection portions 510, as shown in FIG. 7. In detail, a liquid material accommodated in the canister 100 is vaporized and is transmitted to the deposition module 500 through the outlet portion 170. A gas material obtained by vaporizing the liquid material is injected towards the substrate S through the injection portion 510. Thus, a deposition process may be performed on the substrate S by using a desired material.

The vapor deposition apparatus 1000 may be various types of apparatuses. For example, the vapor deposition apparatus 1000 may be an atomic layer deposition (ALD) apparatus. In this case, the deposition module 500 of the vapor deposition apparatus 1000 may include an injection portion for injecting purge gas and may include an exhaust portion and an injection portion for injecting other raw materials. Of course, purge gas and other materials may be sequentially injected through the injection portion 510. Alternatively, the vapor deposition apparatus 1000 may include a plurality of deposition modules 500. In this case, one raw material may be injected into the substrate S by using one deposition module 500 and then another raw material may be injected into the substrate S by using another deposition module 500.

The deposition module 500 may perform a deposition process on the substrate S while being moved. In detail, the deposition module 500 may perform a deposition process while moving in the directions (directions M1 and M2 of FIG. 7) indicated by the arrows in FIGS. 6 and 7. Thus, a deposition process may be easily performed on the substrate S having a large size.

In this case, the canister 100 is connected to the deposition module 500 and thus is moved together with the deposition module 500. The canister 100 may be moved when being fixed to the deposition module 500. In detail, the outlet portion 170 of the canister 100 may be formed of a rigid metallic material that is not flexible. In addition, a separate member may be used to dispose or attach the canister 100 onto the deposition module 500.

The vapor deposition apparatus 1000 includes one or more deposition modules 500 that perform a deposition process while being moved over the substrate S. Thus, although the size of the vapor deposition apparatus 1000 is not changed, the deposition process may be easily performed on the large-sized substrate S. Although not shown, the substrate S may be moved.

In particular, since the canister 100 is moved together with the deposition module 500, the outlet portion 170 for injecting a material from the canister 100 into the deposition module 500 may be formed of a metal having excellent durability instead of a flexible plastic material, and thus, a raw material may be stably supplied to the deposition module 500 from the canister 100 and may be stably prevented from being discharged.

In this case, as described above, even if the canister 100 shakes or moves, the movement of a liquid material in the accommodation portion 110 is minimized, and in particular, the liquid material is effectively prevented from being introduced into the outlet pipe 171. Thus, an unwanted liquid material is prevented from being transferred to the deposition module 500 from the canister 100 and a gas material is smoothly transferred to the deposition module 500, thereby easily increasing the efficiency of a deposition procedure and characteristic of a deposition layer.

Figure 8:
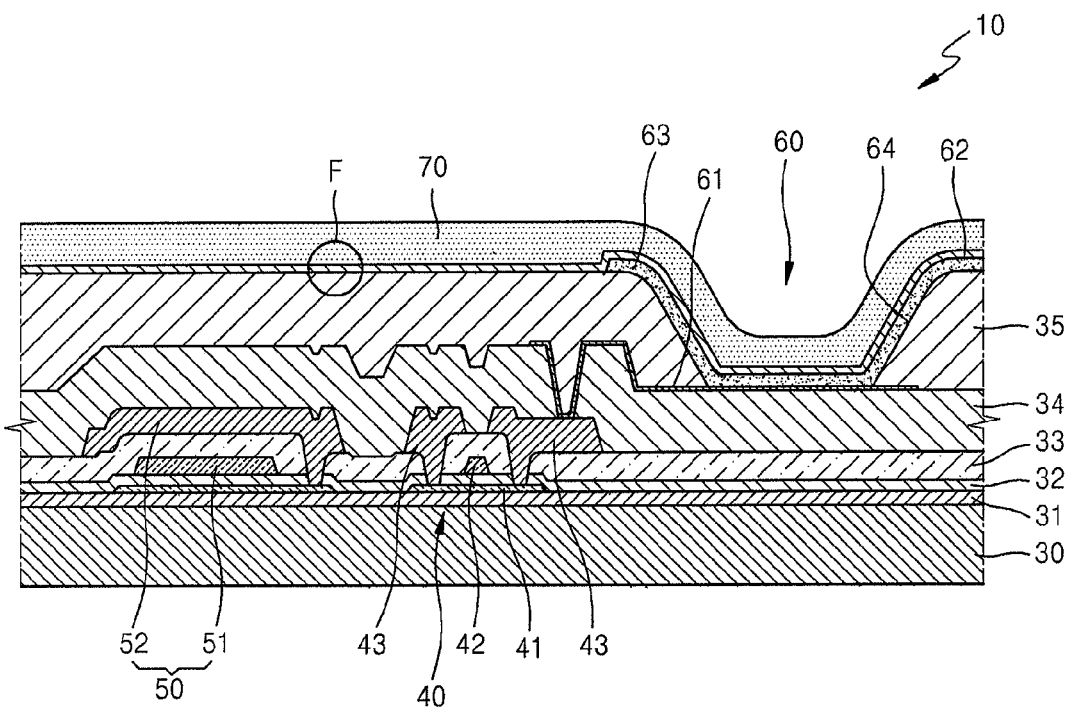
FIG. 8 is a cross-sectional view of an organic light-emitting display apparatus manufactured by using an organic light-emitting display apparatus manufacturing method, according to an embodiment of the present invention.
Figure 9:
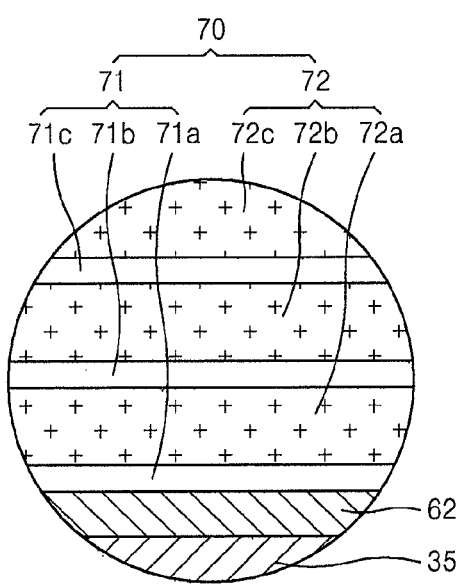
FIG. 9 is a magnified view of a portion F in FIG. 8.

FIG. 8 is a cross-sectional view of an organic light-emitting display apparatus 10 manufactured by using an organic light-emitting display apparatus manufacturing method, according to an embodiment of the present invention. FIG. 9 is a magnified view of a portion F in FIG. 8.

In more detail, FIGS. 8 and 9 illustrate the organic light-emitting display apparatus 10 manufactured by using one of the vapor deposition apparatus 1000.

The organic light-emitting display apparatus 10 is formed on a substrate 30. The substrate 30 may be formed of a glass material, a plastic material, or a metal material.

A buffer layer 31 containing a conductive material is formed on the substrate 30 so as to provide a flat surface on the substrate 30 and to prevent moisture and foreign substances from penetrating into the substrate 30.

A thin film transistor (TFT) 40, a capacitor 50, and an organic light-emitting device 60 are formed on the buffer layer 31. The TFT 40 broadly includes an active layer 41, a gate electrode 42, and source and drain electrodes 43. The organic light-emitting device 60 includes a first electrode 61, a second electrode 62, and an intermediate layer 63.

In more detail, the active layer 41 having a predetermined pattern is formed on a top surface of the buffer layer 31. The active layer 41 may contain an inorganic semiconductor material such as silicon, an organic semiconductor material, or an oxide semiconductor material, and may be formed by injecting a p-type dopant or an n-type dopant.

A gate insulating layer 32 is formed on the active layer 41. The gate electrode 42 is formed on the gate insulating layer 32 so as to correspond to the active layer 41. Then, an interlayer insulating layer 33 is formed to cover the gate electrode 42, and the source and drain electrodes 43 are formed on the interlayer insulating layer 33. Here, the source and drain electrodes 43 contact predetermined regions of the active layer 41. A passivation layer 34 is formed to cover the source and drain electrodes 43. A separate insulating layer may be further formed on the passivation layer 34 so as to planarize the TFT 40.

The first electrode 61 is formed on the passivation layer 34. The first electrode 61 is electrically connected to one of the source and drain electrodes 43. Then, a pixel-defining layer (PDL) 35 is formed to cover the first electrode 61. An opening 64 is formed in the PDL 35, and then the intermediate layer 63, including an organic emission layer (organic EML), is formed in a region defined by the opening 64. The second electrode 62 is formed on the intermediate layer 63.

An encapsulation layer 70 is formed on the second electrode 62. The encapsulation layer 70 may contain an organic material or an inorganic material and may have a structure in which the organic material and the inorganic material are alternately stacked.

The encapsulation layer 70 may be formed by using the vapor deposition apparatus 1000. That is, when the substrate 30 whereon the second electrode 62 is formed passes under the vapor deposition apparatus 1000, a desired layer may be formed.

In particular, the encapsulation layer 70 includes an inorganic layer 71 and an organic layer 72. In this regard, the inorganic layer 71 includes a plurality of layers 71a, 71b, and 71c, and the organic layer 72 includes a plurality of layers 72a, 72b, and 72c. Here, the plurality of layers 71a, 71b, and 71c of the inorganic layer 71 may be formed by using the vapor deposition apparatus 1000.

However, aspects of the present invention are not limited thereto. That is, other insulating layers including the buffer layer 31, the gate insulating layer 32, the interlayer insulating layer 33, the passivation layer 34, the PDL 35, and the like of the organic light-emitting display apparatus 10 may be formed by using the vapor deposition apparatus 1000.

Also, various thin films including the active layer 41, the gate electrode 42, the source and drain electrodes 43, the first electrode 61, the intermediate layer 63, the second electrode 62, and the like may be formed by using the vapor deposition apparatus 1000.

As described above, when the vapor deposition apparatus 1000 is used, characteristic of the deposition layer formed by the organic light-emitting display apparatus 10 is improved, so that an electrical characteristic and an image quality of the organic light-emitting display apparatus 10 may be improved.

In addition, a thin film included in a liquid crystal display (LCD) apparatus other than the organic light-emitting display apparatus 10 or thin films include other various display apparatuses may be formed by using the vapor deposition apparatus 1000. Of course, the present invention is not limited thereto and thin films having various other uses may be formed by using the vapor deposition apparatus 1000.

According to the canister, the vapor deposition apparatus including the same, and the method of manufacturing the organic light-emitting display apparatus of the one or more embodiments of the present invention, the deposition procedure may be efficiently performed and characteristics of the deposition layer may be easily improved.

While embodiments of the present invention have been particularly shown and described, it will be understood by those of ordinary skill in the art that various changes in form and details may be made therein without departing from the spirit and scope of the present invention as defined by the following claims.

What is claimed is:

1. A canister comprising:
    a container configured to contain a liquid material;
    an outlet conduit connected to an outlet of the container and configured to discharge a gaseous material vaporized from the liquid material;
    a first blocking structure provided in the container and comprising a cover covering the outlet to inhibit the liquid material from reaching the outlet conduit;
    a plurality of baffle plates disposed within the container, the plurality of baffle plates being spaced apart from each other; and
    a second blocking structure located below the first blocking structure, the second blocking structure comprising a main body extending inwardly from a side wall of the container, the second blocking structure further comprising a flange generally extending downward from the main body to inhibit a portion of the liquid material moving upwardly from reaching a through hole defined by the second blocking structure.

2. The canister of claim 1, wherein the container is divided into an upper space and a lower space by the second blocking structure, and
    wherein the upper space and the lower space are connected to and in fluid communication with each other through the through hole.

3. The canister of claim 1, wherein the main body is tightly attached to the side wall of the container.

4. The canister of claim 1, wherein the flange extends generally downward from an innermost end of the main body member.

5. The canister of claim 1, wherein the cover is spaced apart from the outlet.

6. The canister of claim 1, wherein the cover extends over the outlet.

7. The canister of claim 1, wherein the cover is spaced apart from the side wall of the container.

8. The canister of claim 1, wherein the cover has a plate shape.

9. The canister of claim 1, further comprising an inlet conduit connected to the container in order to introduce carrier gas into the container,
    wherein the cover is spaced apart from an inlet of the container, which is connected to the inlet conduit.

10. The canister of claim 1, further comprising an inlet conduit connected to the container so as to introduce carrier gas into the container,
    wherein the cover extends over an inlet of the container, which is connected to the inlet conduit.

11. The canister of claim 1, further comprising a supporter supporting the plurality of baffle plates,
    wherein the supporter extends through the plurality of baffle plates.

12. The canister of claim 1, further comprising a supporter formed to contact a bottom wall of the container.

13. The canister of claim 1, further comprising a supporter connected to the cover.

14. The canister of claim 1, further comprising an inlet conduit connected to the container in order to introduce carrier gas into container,
    wherein the inlet conduit is spaced apart from the liquid material stored in the container.

15. The canister of claim 1, further comprising an inlet conduit connected to the container in order to introduce carrier gas into container,
    wherein an end of the inlet conduit is configured to be immersed in the liquid material stored in the container.

16. The canister of claim 15, wherein the inlet conduit extends through the first blocking structure, the second blocking structure, and at least part of the plurality of baffle plates.

17. The canister of claim 1, further comprising one or more level sensors configured to detect an amount of the liquid material contained in the container.

18. The canister of claim 17, wherein each of the one or more level sensors is disposed on one surface of one of the plurality of baffle plates.

19. The canister of claim 17, further comprising a supporter extending through the plurality of baffle plates so as to support the plurality of baffle plates, wherein the supporter extends through the one or more level sensors.

20. The canister of claim 17, further comprising an inlet conduit connected to the container and extends in the container in order to introduce carrier gas into the container, wherein the inlet conduit extends through the one or more level sensors.

* * * * *